(12) United States Patent
Ray et al.

(10) Patent No.: US 8,772,814 B2
(45) Date of Patent: Jul. 8, 2014

(54) PHOSPHOR LAYER CONTAINING TRANSPARENT PARTICLES OVER BLUE LED

(71) Applicant: Nthdegree Technologies Worldwide Inc., Tempe, AZ (US)

(72) Inventors: William J. Ray, Fountain Hills, AZ (US); Reuben Rettke, Phoenix, AZ (US); Mark D. Lowenthal, Gilbert, AZ (US); Alexander Ray, Tempe, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 13/906,751

(22) Filed: May 31, 2013

(65) Prior Publication Data

US 2014/0117387 A1 May 1, 2014

Related U.S. Application Data

(60) Provisional application No. 61/718,879, filed on Oct. 26, 2012.

(51) Int. Cl.
| H01L 33/00 | (2010.01) |
| H01L 33/50 | (2010.01) |
| C09K 11/02 | (2006.01) |

(52) U.S. Cl.
CPC ............ H01L 33/502 (2013.01); C09K 11/025 (2013.01)
USPC .. 257/98; 257/88; 257/E33.061; 257/E33.073

(58) Field of Classification Search
CPC ............................ H01L 33/502; C09K 11/025
USPC ......................................... 257/88, E33.061, 98
See application file for complete search history.

(56) References Cited

U.S. PATENT DOCUMENTS

| 2007/0013291 A1 | 1/2007 | Cok et al. | |
| 2009/0114938 A1 | 5/2009 | Hsu et al. | |
| 2011/0069490 A1 | 3/2011 | Liu | |
| 2011/0089456 A1* | 4/2011 | Andrews et al. | 257/98 |
| 2012/0043577 A1* | 2/2012 | Imazawa et al. | 257/99 |

OTHER PUBLICATIONS

PCT/US2013/060137, International Search Report and Written Opinion, 10 pages, Dec. 20, 2013.

* cited by examiner

*Primary Examiner* — Hsin-Yi Hsieh
(74) *Attorney, Agent, or Firm* — Patent Law Group LLP; Brian D. Ogonowsky

(57) ABSTRACT

LED dies are suspended in an ink and printed on a first support substrate to form a light emitting layer having a light emitting surface emitting primary light, such as blue light. A mixture of a transparent binder, phosphor powder, and transparent glass beads is formed as an ink and printed over the light emitting surface. The mixture forms a wavelength conversion layer when cured. The beads are preferably sized so that the tops of the beads protrude completely through the conversion layer. Some of the primary light passes through the beads with virtually no attenuation or backscattering, and some of the primary light is converted by the phosphor to secondary light. The combination of the secondary light and the primary light passing though the beads may form white light. The overall color is highly controllable by controlling the percentage weight of the beads.

15 Claims, 3 Drawing Sheets

PHOSPHOR LAYER CONTAINING TRANSPARENT PARTICLES OVER BLUE LED

CROSS-REFERENCE TO RELATED APPLICATIONS

This application is based on and claims the benefit of U.S. Provisional Application Ser. No. 61/718,879, filed on Oct. 26, 2012, by William Ray, assigned to the present assignee and incorporated by reference.

FIELD OF THE INVENTION

This invention relates to phosphor layers, such as a phosphor layer that leaks a controlled amount of primary light and creates an overall white light emission, and, in particular, to a technique for controlling the primary light leakage through such a phosphor layer.

BACKGROUND

It is common to provide a white light source by applying a yttrium aluminum garnet (YAG) phosphor layer over a blue light emitting diode (LED) die. The YAG phosphor emits a yellow-green light when energized by the blue light, and the combination of the blue light leaking through the phosphor layer and the yellow-green light creates white light. Many other colors can be formed in this way, and the invention is not limited to YAG phosphor or the use of LEDs.

FIG. 1 illustrates a conventional GaN-based LED die 10 that emits blue light. The die 10 may be a flip-chip die (both electrodes on bottom), a vertical die (one electrode on top and another on bottom), a lateral die (both electrodes on top), or other type of LED die. The LED semiconductor layers include an N-type layer 12, an active layer 14 (forming quantum wells), and a P-type layer 16. The active layer 14 emits blue light, in the example, such as light rays 18-21. These layers are epitaxially grown on a surface of a growth substrate (not shown), which may remain or is removed, depending on the type of die.

On top of the die 10 is deposited a phosphor layer 24. The phosphor layer 24 may be formed of a single phosphor or a combination of different phosphors, and may be a single layer or multiple layers. The phosphor layer 24 is typically formed of phosphor powder in a binder (e.g., silicone) or may a sintered tile of phosphor. If the phosphor layer 24 is in liquid form when deposited, it may be sprayed on for a wide-area application or deposited using a hollow needle for a die-by-die application. The density and thickness of the phosphor layer 24 must be carefully controlled, since the precise percentages of phosphor light and blue leakage light are required for generating a target color. In reality, the resulting color is variable due to the inability of the processes to consistently achieve the required amount of blue light leakage. The unevenness of the phosphor layer also adds to the variation in output color due to the variation in blue light leakage. Further, different LEDs, even from the same wafer, have slightly different peak wavelengths and flux, which change the required leakage properties of the phosphor layer 24.

In FIG. 1, phosphor particles 26A-26D in the layer 24 are shown energized by the blue light emitted by the active layer 14 and wavelength shift the light. The light emitted by the phosphor particles is generally isotropic, and the particular direction of a light ray emission is significant.

Light ray 18 is shown energizing particle 26A, and the secondary light emission is out of the top surface of the phosphor layer 24. Light ray 19 leaks through the phosphor layer 24. Light ray 20 is shown energizing particle 26B, and the secondary light emission is backscattered into the semiconductor layers and partially absorbed until it is somehow reflected back towards the top surface, such as by a bottom reflective electrode. Light ray 21 is shown energizing particle 26C, and the secondary light emission is backscattered by another particle 26D back into the semiconductor layers to be partially absorbed.

Any secondary light that is redirected back towards the semiconductor layers reduces the overall efficiency of the phosphor-converted LED (pcLED). Light extraction efficiency relates to the percentage of generated photons that escape the LED die 10. One goal in designing an LED die is to minimize light absorption so as to increase light extraction efficiency.

FIG. 2 illustrates the same phosphor layer 24 deposited on a transparent support substrate 30, which may be a flat plate or a lens, and the phosphor layer 24 is remote from the LED die 10. In this context, the term "remote" means that the phosphor layer 24 is separated from the semiconductor layers by some material or air. Light rays 32 and 33 are shown being emitted by the die 10. The same problems described with respect to FIG. 1 apply to FIG. 2.

Accordingly, as seen with respect to FIGS. 1 and 2, there is reduced efficiency caused by the backscattering, and the tolerances for the phosphor density and phosphor layer 24 thickness (affecting the blue light leakage) cause the resulting color to not be tightly controlled.

What is needed is a way to improve the color control of pcLEDs and improve the efficiency of such pcLEDs.

SUMMARY

In one embodiment, phosphor powder is mixed in a transparent binder along with transparent beads in a certain proportion. The index of refraction of the beads should be close to, or less than, the index of the binder to minimize reflection. Suitable binders of selectable indices are commercially available. The transparent beads may be glass and may be doped to have a selectable index. The diameter of the beads is selected to be greater than an anticipated thickness of the phosphor layer.

In one embodiment, the mixture is deposited as a layer over an array of LEDs supported on a single substrate forming a light sheet. There may be millions of microscopic LED dies spread over the substrate to make a large-area white light source for general illumination purposes. In one embodiment, the mixture is printed over the array. Various printing techniques may be used, such as flexography, screen printing, gravure, etc. In one embodiment, the LED dies and phosphor mixture are printed using the same technique for maximum efficiency. Printing the LED dies as an ink enables the LED dies to be generally uniformly distributed as a monolayer.

In another embodiment, the phosphor mixture is sprayed over the LED die array.

Since the beads have a controllable diameter greater than the layer thickness, there will be transparent paths substantially uniformly spread out over the phosphor layer surface. A de-wetting agent may be added to the mixture to cause the binder/phosphor to de-wet off the tops of the beads by capillary action so that there is little or no phosphor over the tops of the beads.

The number of beads (directly corresponding to a predetermined transparent area per unit area of the phosphor layer) contained in the mixture directly controls the amount of primary light leaking through the phosphor layer, so the amount of leakage light is not solely dependent on the density of the phosphor particles and the thickness of the phosphor layer. The number of beads is determined by the percentage weight of beads in the mixture. The phosphor layer may be made very thin and dense so that almost all leakage light is tightly controlled by the number of beads in the mixture (assuming a generally homogenous distribution of the beads in the mixture). Accordingly, process variations in the density, thickness, and uniformity of the phosphor layer will have little or no effect on the overall color emission of the pcLED.

The diameters of the beads may be selected based on the desired thickness of the phosphor layer. Generally, it is desired to have smaller beads so that they are more densely distributed over the LED(s) to create a more uniform emission.

The phosphor layer may be used over individual LED dies as well, such as over LED dies in a reflective cup.

The phosphor layer may be deposited directly on the LEDs or over an intermediate material, including a lens.

The phosphor layer may also be pre-formed as rigid or flexible tile or sheet that is affixed to the top of an LED or over an array of LEDs.

In another embodiment, a mixture containing phosphor, but no beads, is deposited over a transparent substrate sheet that has bumps that substitute for the beads. The phosphor mixture may have a de-wetting agent (which may be a characteristic of the binder itself) that prevents the phosphor from remaining over the tops of the bumps. When the sheet is laminated over an LED array, the primary light from the LEDs passes through the sheet and the bumps. The phosphor layer between the bumps may convert all the remaining primary light to a longer wavelength(s) or allow a percentage of the primary light to pass through. The bump diameters and pattern can be used to precisely control the amount of primary light that passes through the sheet and allows precise control over the distribution of the primary light that passes through the sheet.

Other embodiments are described.

BRIEF DESCRIPTION OF THE DRAWINGS

Elements that are the same or similar are labeled with the same numeral.

DETAILED DESCRIPTION

Figure 1:
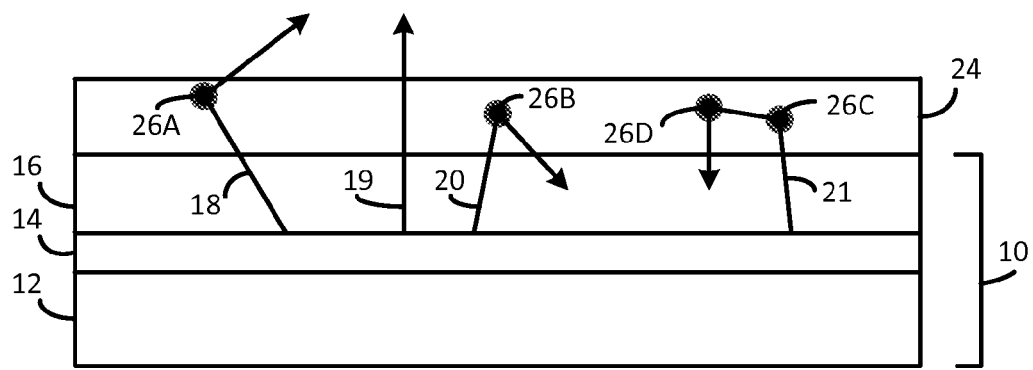
FIG. 1 is a cross-sectional view of a portion of a conventional LED die having a conventional phosphor layer formed over it, where the overall light emission is a combination of the LED primary leakage light and the phosphor secondary light.
Figure 2:
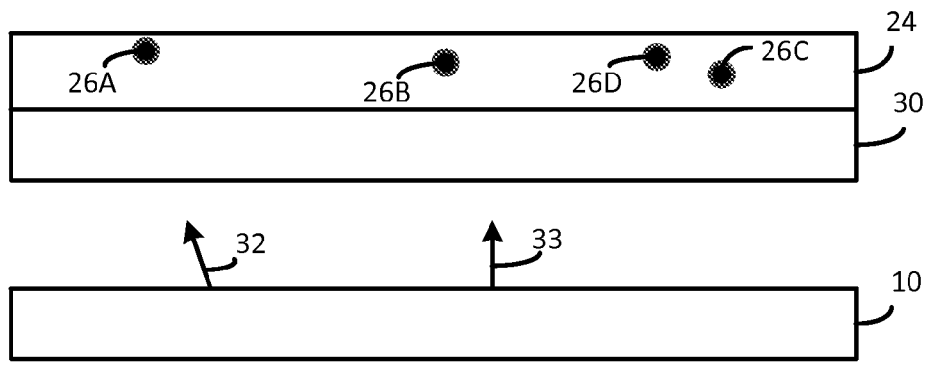
FIG. 2 is a cross-sectional view of a conventional LED and a conventional remote phosphor layer.
Figure 3:
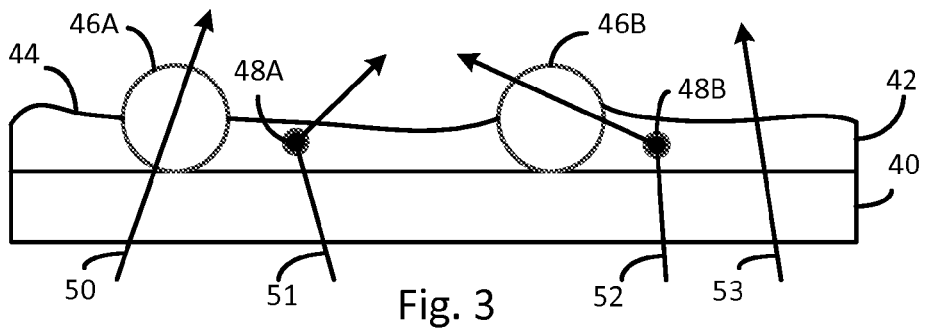
FIG. 3 is a cross-sectional view of an LED with a phosphor layer in accordance with one embodiment of the inventions.

FIG. 3 illustrates a support surface 40 on which a phosphor layer 42 of the present invention is deposited. The support surface 40 may be the top semiconductor layer of an LED die, such as the N-type layer 16 in FIG. 1, or may be the top surface of an LED wafer before singulation, or may be a transparent substrate for a remote phosphor application, or may be the top surface of an array of LED dies supported on another substrate, or may be the surface of a lens, etc. The particular light source is not important for the invention. If the light source is an LED die, the LED die may be any type of die (flip-chip, vertical, lateral, etc.) and emit any suitable primary color, such as blue, green, etc.

In one embodiment, a viscous mixture of ceramic phosphor particles (a powder), a transparent binder 44, and generally spherical transparent glass beads 46A/46B (referred to generally as beads 46) is created so that the materials are substantially uniformly distributed in the mixture. Only two phosphor particles 48A and 48B are shown in FIG. 3 for simplicity, and the phosphor particles will be generally referred to as particles 48. The cured mixture forms the phosphor layer 42.

In the example of FIG. 3, a primary light ray 50, from an LED active layer or other light source, is shown directly passing through the transparent bead 46A with virtually no attenuation. Light ray 51 is shown being absorbed by the phosphor particle 48A and efficiently re-emitted as a secondary light ray at a longer wavelength toward the top surface. Another light ray 52 is shown absorbed by the phosphor particle 48B and the secondary light ray passes through the bead 46B without any possibility of backscatter or attenuation by other phosphor particles. Light ray 53 is shown leaking through the phosphor layer 42 in the conventional way. Depending on the phosphor density and thickness, there may be no leakage of primary light except via the beads 46, so that the leakage light is directly and highly accurately controlled by the percentage weight of the beads 46 in the mixture.

In one embodiment, to create the mixture, 48±4 μm diameter clear glass beads (available from Potters Industries, Malvern, PS, USA) are mixed with conventional YAG phosphor powder and a transparent binder in the following percentages by weight as an ink suspension: 9% (beads): 51% (YAG): 40% (binder). The YAG phosphor may be any of several commercially available YAGs that are typically used in conjunction with a blue LED. The binder 44 may consist of a 56.20%: 32.20%: 5.00%: 5.00%: 0.50%: 1.20% mixture of the chemicals listed in Table 1 below.

TABLE 1

| Binder Materials. | | |
|---|---|---|
| Material | Source | Function |
| CN 9030 | Sartomer Exton, PA, USA | Polycarbonate - Urethane Acrylate Oligomer |
| CD 420 | Sartomer Exton, PA, USA | Acrylic Ester Monomer |
| CD 560 | Sartomer Exton, PA, USA | Diacrylate Cross-linking Agent |

TABLE 1-continued

Binder Materials.

| Material | Source | Function |
| --- | --- | --- |
| Irgacure 184 | Ciba, Basel, Switzerland | Photo Initiator, short UV wavelength |
| Irgacure 819 | Ciba, Basel, Switzerland | Photo Initiator, long UV wavelength |
| Modaflow 2100 | Cytec Industries, Woodland Park, NJ, USA | Flow aid |

The chemistry used in the binder 44 is quite polar. This polarity promotes the de-wetting of the glass beads 46 by both the binder 44 and the phosphor particles 48, thus allowing the beads 46 to protrude through the phosphor layer 42. Ideally, the refractive index of the beads 46 is generally matched to that of the binder 44 to minimize reflections, and such materials are available.

Many other suitable combinations of materials and ratios may be used to form the viscous mixture. The phosphor layer 42 may also include a red phosphor to create a warmer white light.

The resulting mixture (an ink) is then screen printed using a 180 mesh screen with 80 μm open areas to evenly distribute the mixture over the support surface 40 of FIG. 3, which may be an array of LED dies. The deposited phosphor layer 42 is then cured, such as by heat or UV light.

Other forms of printing may be used, such as flexography or gravure. In another embodiment, the mixture is sprayed over the support surface 40. Other deposition techniques are envisioned, including a spin-on process. The optimal deposition process depends on the particular application.

In the example of using 48 μm diameter beads, the thickness of the phosphor layer 42 is anything less than 48 μm thick so that the tops of the beads 46 are exposed. In one embodiment, the thickness of the phosphor layer 42, other than the beads 46, is about 25 μm.

The invention still provides a benefit even if the phosphor layer 42 is slightly thicker than the diameter of the beads 46, or if some phosphor remains over the beads 46, since there will be very little absorption of the light exiting the beads 46 from the thin layer of phosphor over the beads 46 (i.e., a vast majority of the primary light will leak through the thin layer over the beads 46).

In another embodiment, multiple phosphor layers may be deposited or different types of phosphors may be mixed in a single layer. The beads 46, in one or more of the layers, will still produce its benefits of less backscattering of light (improving efficiency) and more controllable color emission.

The diameters of the beads 46 may range from 25-500 μm, depending on the type of phosphor used, the density of phosphor, the color uniformity required, the required phosphor layer thickness, the overall color desired, and other factors. For example, in an application where the light will be viewed by an observer at a distance, uniformity of color across a wide array of LEDs is not critical, and the beads 46 may be relatively large.

Figure 4:
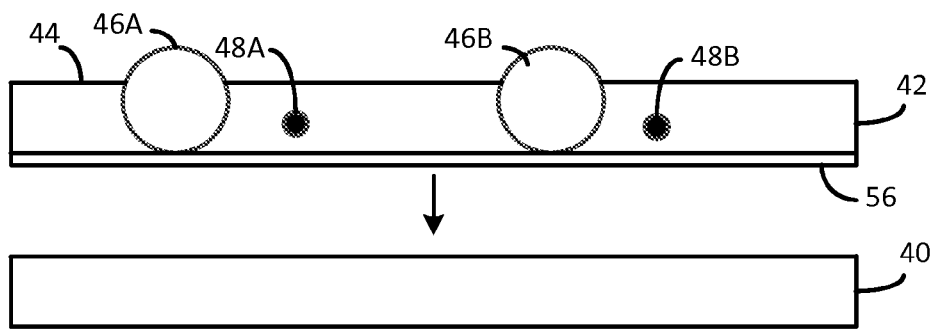
FIG. 4 illustrates how the phosphor layer may be pre-formed and affixed over the LED in accordance with another embodiment of the invention.

FIG. 4 illustrates that the phosphor layer 42 may be preformed as a rigid or flexible tile or sheet and laminated over the support surface 40 using a transparent adhesive layer 56. The adhesive layer 56 may be the same material as the cured binder 44 or may be another material, such as silicone.

Figure 5:
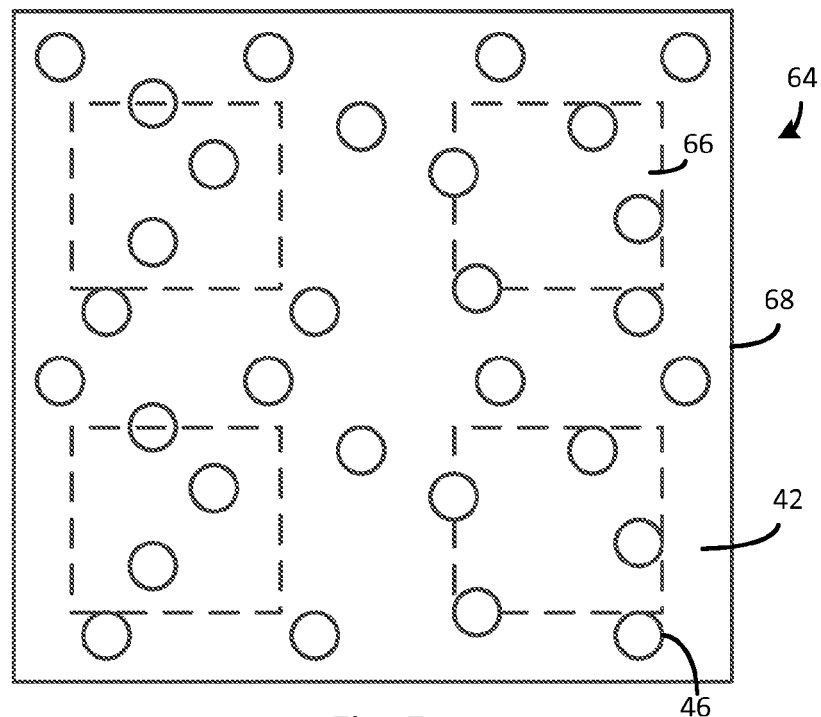
FIG. 5 is a top down view of a portion of a large array of LED dies supported on a single substrate, where the phosphor layer is deposited over the entire array as a single layer.

FIG. 5 is a top down view of a small portion of a light sheet 64 that may be used as an overhead light for general illumination. The light sheet 64 may be created by printing millions of microscopic vertical LED dies 66 (only four are shown) on a flexible aluminum substrate 68 that electrically connects to a bottom anode or cathode electrode of the LED dies 66. A transparent conductor may then be printed over the LED dies 66 to electrically connect to the other of the anode or cathode electrodes. A transparent dielectric material may be printed over the LED dies 66 for encapsulation and mechanical support and provide a substantially planarized surface. Such a surface may be the support surface 40 in FIG. 3 or 4. The light sheet 64 may be any size, such as a few meters wide and long. When a driving current is applied, the LED dies 66 emit blue light.

The phosphor layer 42 is then printed over the light sheet 64. The phosphor may include YAG phosphor and red phosphor for creating warm white light, or any other types of phosphors. The transparent glass beads 46 are substantially uniformly distributed over the surface to substantially uniformly contribute the blue primary light to the overall light output. Since the LED dies 66 are very small and have a relatively high density to create the required flux, and since the phosphor layer 42 diffuses the light, the resulting light emission will appear substantially uniform to an observer.

Since there may be many panels of the light sheet 64 in an office, it is important to match the color emissions (e.g., color point) of the panels. Since the same phosphor layer mixture may be used to coat many panels, and the LED dies 66 generate a very repeatable average peak wavelength from panel to panel, the color point of each panel may be closely matched.

In another embodiment of forming the phosphor layer 42, the beads 46 may first be printed as an ink in a light binder or solvent over the support surface 40. The binder/solvent contains a de-wetting agent. The binder/solvent may then be cured (e.g., evaporated) while the beads 46 remain in place. The phosphor mixture, without beads, is then printed as an ink over the beads 46, and the phosphor/binder de-wets off the tops of the beads 46 and forms the layer 42 in FIGS. 3-5. The same printing process described above may be used for both layers. In such a process, the amount of each ink is selected to achieve the desired percentages of beads, phosphor particles, and binder in the final layer 42 to achieve the target color.

In an actual embodiment, a top down view of the microscopic printed LED dies 66 would show them as generally hexagonal. The printing of such LED dies 66 is described in U.S. Pat. No. 8,415,879, incorporated herein by reference. The shape of the LED dies 66 is designed to cause about 90% of the LED dies 66 to be correctly oriented on the substrate 68 after printing. For maximum efficiency, the same printing technique is used to print the LED dies 66 and the phosphor layer 42. For a very high throughput, a flexographic web press is used to print the LED dies 66 and phosphor layer 42 over the substrate 68. The ink (in this case, a liquid or gel containing the LED dies 66 or the phosphor mixture) is forced through a fine mesh to precisely control the amount of ink on a flexible plate. The plate is brought against the substrate 68 to transfer the ink to the substrate 68. In this way, the LED dies 66 may be printed in a monolayer and generally uniformly distributed. The phosphor mixture may be printed to any thickness. The plate may be on a roller and prints as the flexible substrate 68 is moved past the roller for high throughput printing in a roll-to-roll process.

Figure 6:
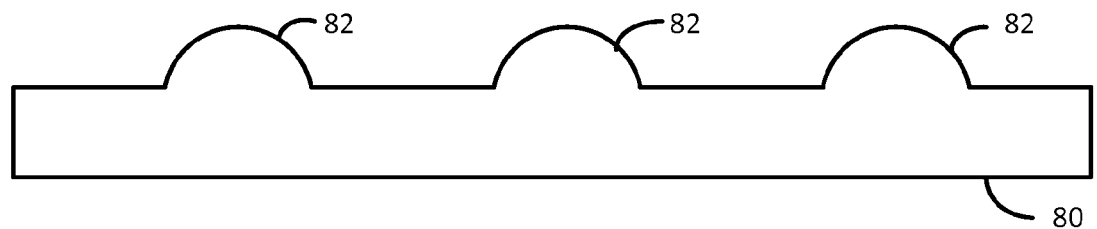
FIG. 6 is a cross-sectional view of a transparent substrate having substantially hemispherical bumps arrayed across its surface that substitute for the transparent beads in the embodiment of FIG. 3.

FIG. 6 illustrates another embodiment in which a transparent substrate 80, such as an acrylic, is formed, such as by molding, to have an ordered or pseudo-random array of substantially hemispherical bumps 82 or other raised texturing on its surface. The substrate 80 may be formed as a roll to be used in a roll-to-roll process. The diameters of the bumps 82 may be on the same order as the beads 46 discussed above. The substrate 80 should be as thin as practical to minimize light attenuation, so will be flexible.

Figure 7:
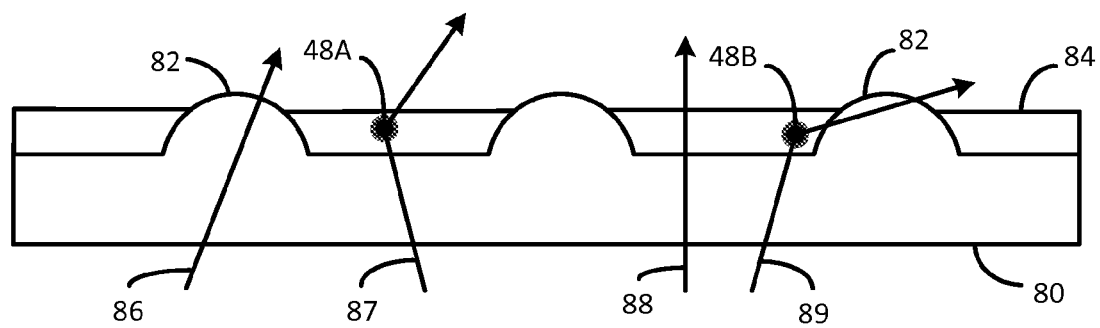
FIG. 7 illustrates how a phosphor mixture is deposited over the substrate of FIG. 6 so that the tops of the bumps protrude through the phosphor mixture to pass primary light from a light source, such as an LED or LED array, in accordance with another embodiment of the invention.

As shown in FIG. 7, a phosphor layer 84, without any glass beads, is deposited over the substrate 80, such as by printing. A de-wetting agent may be added to the binder to cause the phosphor/binder to de-wet off the bumps 82 by capillary action. Preferably, the phosphor layer 84 does not cover the tops of the bumps 82, but the advantages of the invention are still realized even if the phosphor layer 84 covers the bumps 82.

The density and size of the bumps 82 are designed to achieve the desired primary light leakage in the same way that the percentage weight of the beads 46 (FIG. 3) is used to control the leakage. By using the pre-formed substrate 80, the primary light leakage will be more uniform.

The density and/or thickness of the phosphor layer 84 may be selected to achieve the desired combination of primary and secondary light to achieve the target color point, and the color point will be less sensitive to the thickness of the layer 84 compared to the prior art.

The substrate 80 may be laminated to any support surface (such as the support surface 40 in FIG. 4) before or after the phosphor layer 84 is deposited. The support surface 40 may be any surface which emits or passes the primary light, such as the light sheet 64 in FIG. 5 or an LED surface.

FIG. 7 illustrates light ray 86 from a light source, such as an LED, directly passing through a transparent bump 82. Light ray 87 is shown being absorbed by a phosphor particle 48A and emitted as secondary light through the top surface of the phosphor layer 84. Light ray 88 is shown leaking through the phosphor layer 84. And light ray 89 is shown being absorbed by a phosphor particle 48B and emitted as secondary light through a transparent bump 82.

Figure 8:
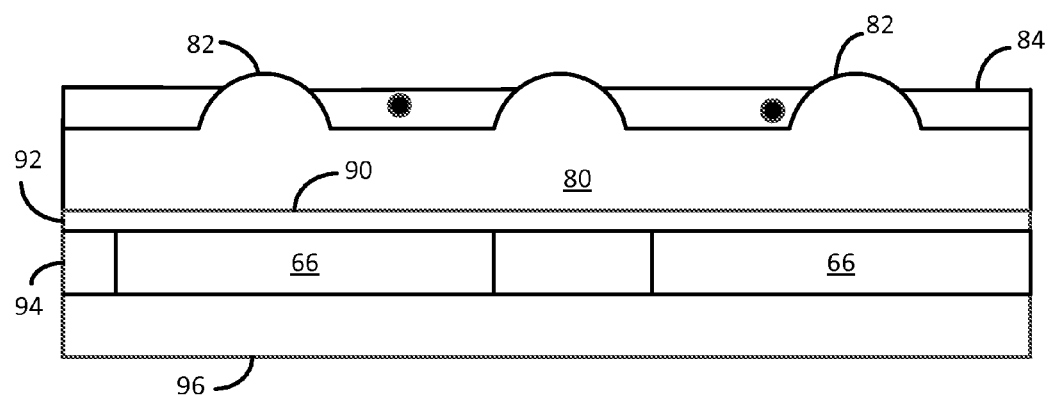
FIG. 8 illustrates a single support substrate supporting the LED dies on one side and the phosphor layer on the opposite side.

In another embodiment, shown in FIG. 8, the LED dies 66 are printed as an ink on the flat side 90 of the substrate 80, prior to or after the phosphor layer 84 is formed. A transparent conductor layer 92 may first be deposited to make electrical contact to the LED dies' "top electrodes" to form a light sheet similar to that of FIG. 5. Metal traces (outside of the cross-section) may also be printed to increase electrical conductivity to the dies 66. A dielectric layer 94 is then printed over the transparent conductor layer 92, followed by the printing of a metal layer 96 to electrically contact the "bottom" LED die electrodes. The LED dies, in groups of any size, may thus be connected in parallel. The metal layer 96 is preferably reflective so almost all light is emitted in the direction of the phosphor layer 84. A suitable voltage applied to the transparent conductor layer 92 and metal layer 96 may generate the light rays shown in FIG. 7.

In the embodiments of FIGS. 3-8, the transparent beads/bumps gather primary light and secondary light and may also focus the primary light as lenses. The shapes of the beads/bumps may be made non-spherical to have other optical characteristics. The beads/bumps may be roughened, for example, to diffuse the light and reduce reflections. For creating a highly controlled emission, the bump 82 geometry may be selected to direct the light in any direction. A variety of geometries may be used in the same light structure to achieve a desired emission.

The invention also allows less phosphor to be used so results in a more cost-effective approach to color conversion via both the reduction of phosphor use and greater device conversion efficiency.

Figure 9:
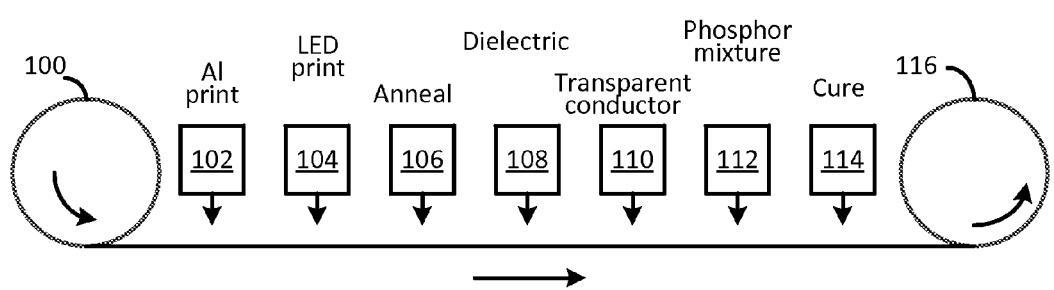
FIG. 9 illustrates a simplified roll-to-roll process for forming light sheets.

FIG. 9 illustrates a simplified fabrication process for forming wide-area phosphor-converted LED light sheets that emit white light for general illumination, such as for replacing fluorescent light fixtures in an office. A roll-to-roll process is shown.

A roll 100 of a thin flexible substrate, such as a polymer or aluminum, is provided. The substrate may be moved along the assembly line continuously or intermittently. A single process may be performed on the entire roll before the roll is subjected to the next process. FIG. 9 serves to show the various processes that may be performed on the substrate, rather than an actual assembly line. For example, the same printing tools may be used to deposit different inks at different stages of the process, rather than a different printing tool being used for each type of ink. So there may not be the various separate stations shown in FIG. 9.

At a first station 102, an aluminum ink is printed over the surface of the substrate to form an aluminum layer.

At a second station 104, the LED dies 66 (FIG. 5) are printed so that the bottom electrodes of the dies 66 make electrical contact with the aluminum layer.

At a third station 106, the aluminum layer is annealed to fuse the LED dies' bottom electrodes to the aluminum layer.

At a fourth station 108, a dielectric layer is printed over the aluminum layer.

At a fifth station 110, a transparent conductor is printed over the top electrodes of the LED dies 66 to electrically connect groups of the LED dies in parallel. Metal traces may also be printed to reduce the overall resistance of the current paths.

At a sixth station 112, the phosphor mixture, containing the transparent beads 46 (FIG. 5), is printed over the LED die array. The phosphor layer deposited (or laminated) may be any of the phosphor layers of FIG. 3, 4, 7, or 8.

At a seventh station 114, the resulting light sheet layers are cured.

The light sheet is then provided as a roll 116. The light sheets may be separated (cut) from the roll 116 at a later time and mounted in a fixture.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting structure comprising:
   a primary light source generating primary light;
   a first mixture comprising wavelength conversion particles, transparent particles, and a binder, wherein the wavelength conversion particles and the transparent particles are substantially uniformly distributed in the binder, the first mixture overlying the primary light source, wherein the binder forms a layer having a thickness less than a diameter of the transparent particles in the first mixture,
   wherein the transparent particles completely protrude through the binder along the layer,
   wherein a first portion of the primary light passes through the transparent particles, and a second portion of the primary light is converted by the wavelength conversion particles to secondary light, and
   wherein a combination of the secondary light and the primary light passing though the transparent particles contributes to an overall color emission.

2. The structure of claim 1, further comprising a support surface on which the first mixture is deposited.

3. The structure of claim 1, wherein the support surface overlies one or more light emitting diodes (LED).

4. The structure of claim 1, further comprising a support surface on which the first mixture is deposited, wherein the first mixture contains the transparent particles prior to being deposited on the support surface.

5. The structure of claim 1, wherein the transparent particles comprise transparent beads.

6. The structure of claim 1, further comprising a support surface, wherein the first mixture is deposited on a first side of the support surface, and wherein a second side of the support surface has deposited thereon a plurality of light emitting diodes (LEDs).

7. The structure of claim 1, wherein the transparent particles form lenses that redirect the primary light.

8. The structure of claim 1 wherein an index of refraction of the transparent particles is equal to or lower than an index of refraction of the binder.

9. The structure of claim 1, wherein the primary light source comprises an array of light emitting diodes (LEDs), and the first mixture is formed over light emitting surfaces of the LEDs.

10. The structure of claim 9, wherein the array of LEDs, the first mixture, and the transparent particles are affixed together to form an integral light emitting device.

11. The structure of claim 10, wherein the LEDs emit blue light, and a combination of the blue light and secondary light generated by the wavelength conversion particles produces white light.

12. The structure of claim 1 wherein the binder includes a de-wetting agent to promote the binder being removed from the tops of the transparent particles by capillary action.

13. The structure of claim 1, wherein the wavelength conversion particles comprises phosphor.

14. The structure of claim 1, wherein the first mixture is deposited over the primary light source as a liquid.

15. The structure of claim 1, wherein the first mixture is pre-formed as a solid structure and later affixed to the primary light source.

* * * * *